United States Patent
Davis

(10) Patent No.: US 9,437,943 B1
(45) Date of Patent: Sep. 6, 2016

(54) STACKED SYMMETRIC PRINTED CIRCUIT BOARDS

(71) Applicant: Pure Storage, Inc., Mountain View, CA (US)

(72) Inventor: John D. Davis, Mountain View, CA (US)

(73) Assignee: Pure Storage, Inc., Mountain View, CA (US)

(*) Notice: Subject to any disclaimer, the term of this patent is extended or adjusted under 35 U.S.C. 154(b) by 0 days.

(21) Appl. No.: 14/659,469

(22) Filed: Mar. 16, 2015

(51) Int. Cl.
*H01R 12/00* (2006.01)
*H01R 12/52* (2011.01)
*H05K 3/36* (2006.01)
*H05K 1/14* (2006.01)

(52) U.S. Cl.
CPC ............ *H01R 12/523* (2013.01); *H05K 3/368* (2013.01); *H05K 1/144* (2013.01)

(58) Field of Classification Search
CPC ...................................... H05K 1/144
USPC ....................... 439/65, 74; 361/790
See application file for complete search history.

(56) References Cited

U.S. PATENT DOCUMENTS

| | | | |
|---|---|---|---|
| 7,104,805 B2 * | 9/2006 | Hjort | H05K 1/144 439/74 |
| 8,848,389 B2 * | 9/2014 | Kawamura | H01P 1/047 361/792 |

* cited by examiner

*Primary Examiner* — Tho D Ta
(74) *Attorney, Agent, or Firm* — Womble Carlyle Sandridge & Rice LLP

(57) ABSTRACT

A printed circuit board (PCB) is provided. The PCB includes a connector extending from a surface of the PCB and a bypass feature extending through the PCB. The PCB is constructed so that a first copy of the PCB is configured to be assembled to a second copy of the PCB with the second copy rotated and/or flipped relative to the first copy. An electrical connection to the first copy is accessible via the connector of the first copy, and an electrical connection to the second copy is accessible via the connector of the second copy through the bypass feature of the first copy.

20 Claims, 7 Drawing Sheets

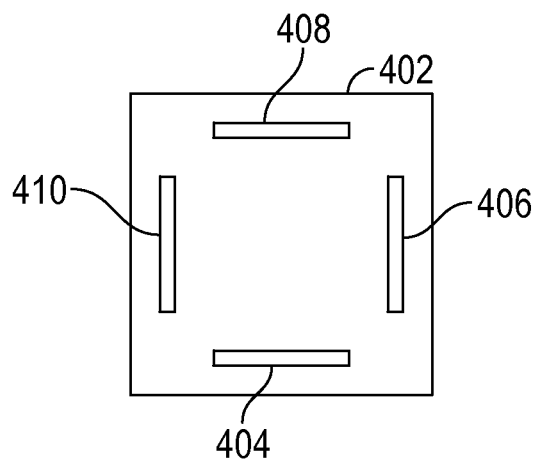
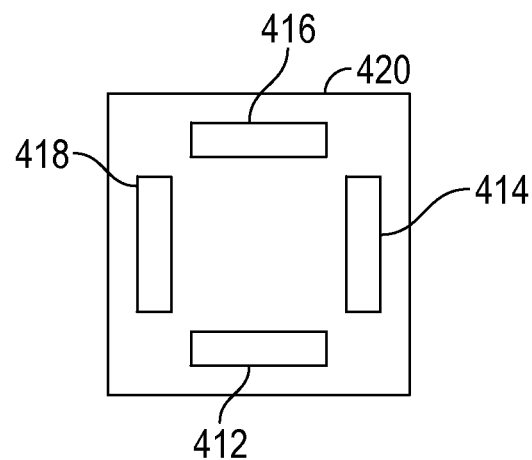
FIG. 4A    FIG. 4B
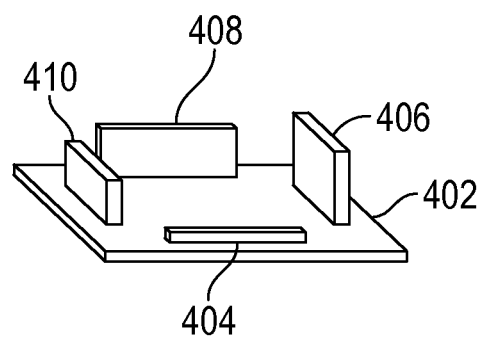
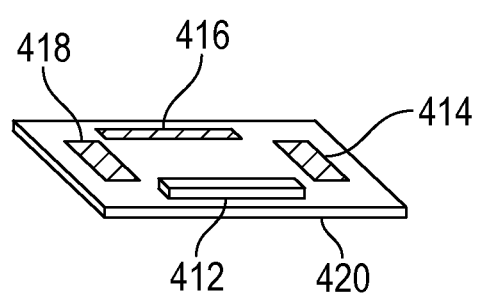
FIG. 4C    FIG. 4D

STACKED SYMMETRIC PRINTED CIRCUIT BOARDS

BACKGROUND

Printed circuit boards (PCBs), with integrated circuits and various components are in common use in electronics products. Stacking printed circuit boards increases circuit density, and is commonly seen in card cages in personal computers, and in mezzanine boards, daughter boards, piggyback boards and various housings and packages of electronics products. Various connectors and connector types facilitate stacking of printed circuit boards. Yet, there is still a need in the art for improvements to arrangements of stacked printed circuit boards, for high density or to meet various form factors.

It is in this context in which the present embodiments arise.

SUMMARY

In some embodiments a printed circuit board (PCB) is provided. The PCB includes a connector extending from a surface of the PCB and a bypass feature extending through the PCB. The PCB is constructed so that a first copy of the PCB is configured to be assembled to a second copy of the PCB with the second copy rotated and/or flipped relative to the first copy. An electrical connection to the first copy is accessible via the connector of the first copy, and an electrical connection to the second copy is accessible via the connector of the second copy through the bypass feature of the first copy.

In some embodiments, a printed circuit board (PCB) assembly is provided. The PCB assembly includes a first PCB having a connector and a bypass feature, a second PCB that is a copy of the first PCB, the second PCB rotated and/or flipped with respect to the first PCB, and assembled to the first PCB, wherein the connector of the second PCB extends through the bypass feature of the first PCB.

In some embodiments, a method of assembling a printed circuit board (PCB) is provided. The method includes providing a first PCB and a second PCB, the second PCB a copy of the first PCB. The method includes arranging a bypass feature of the first PCB so that an electrical connection to the second PCB proceeds through the bypass feature of the first PCB, wherein the second PCB is one of rotated and/or flipped relative to the first PCB and coupling an electrical connector of the first PCB and an electrical connector of the second PCB to a third PCB.

Other aspects and advantages of the embodiments will become apparent from the following detailed description taken in conjunction with the accompanying drawings which illustrate, by way of example, the principles of the described embodiments.

BRIEF DESCRIPTION OF THE DRAWINGS

The described embodiments and the advantages thereof may best be understood by reference to the following description taken in conjunction with the accompanying drawings. These drawings in no way limit any changes in form and detail that may be made to the described embodiments by one skilled in the art without departing from the spirit and scope of the described embodiments.

FIG. 4A is an overhead view of a primary printed circuit board with a square arrangement of connectors.

FIG. 4B is an overhead view of a secondary printed circuit board with a square arrangement of a connector and three apertures.

FIG. 4C is a perspective view of the primary printed circuit board of FIG. 4A.

FIG. 4D is a perspective view of the secondary printed circuit board of FIG. 4B.

DETAILED DESCRIPTION

A primary printed circuit board and two or more secondary printed circuit boards are assembled in a stacked arrangement that promotes high density of electronics components, in various embodiments as described herein. In some embodiments, the primary printed circuit board is a processor or controller board, which may also have local memory, and the secondary printed circuit boards have memory chips. The secondary printed circuit boards are congruent in shape, i.e., all of the secondary printed circuit boards have the same shape as each other in some embodiments. Moreover, each of the identical secondary printed circuit boards has a bypass feature or device such as one or more notches, cutouts, apertures, or pass-through connectors that facilitate coupling of two or more secondary printed circuit boards to each other and the primary printed circuit board, in stacked arrangement. Rotating or flipping one of the secondary printed circuit boards brings a notch, cutout, aperture or pass-through connector (i.e., a bypass feature) of that secondary printed circuit board into alignment with a connector of another one of the secondary printed circuit boards, and also into alignment with a connector of the primary printed circuit board. Various geometric arrangements of a connector (which can include a single-sided connector, a two-sided connector, a compound connector or multiple connectors) of the primary printed circuit board, in conjunction with various geometric arrangements and combinations of bypass features of the secondary printed circuit boards, and various assemblies of printed circuit boards, are shown and described in various embodiments. Further embodiments are possible, applying the teachings disclosed herein.

Figure 1:
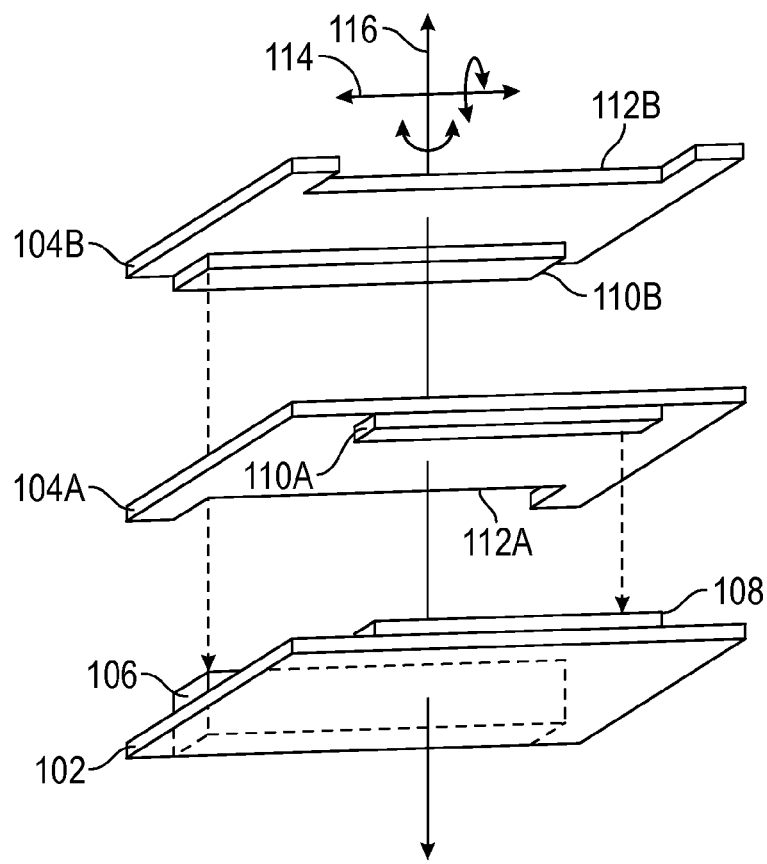
FIG. 1 is a perspective view, from below, of an assembly of stacked printed circuit boards in accordance with an embodiment of the present disclosure.

FIG. 1 is a perspective view, from below, of an assembly of stacked printed circuit boards 102, 104A, 104B in accordance with an embodiment of the present disclosure. A first, vertical axis 116 is shown perpendicular to the printed circuit boards 102, 104A, 104B. A second, horizontal axis 114 is shown perpendicular to the vertical axis 116 and parallel to the printed circuit boards 102, 104A, 104B. The printed circuit boards 102, 104A, 104B are stacked (i.e., in stacked arrangement) along the vertical axis 116. All relative references herein are intended to be gravity-independent, and are employed for convenience of notation and discussion. A primary printed circuit board 102, in the embodiment shown, has a shorter connector 108 and a taller connector 106, adjacent to opposed peripheral parallel edges of the primary printed circuit board 102. In some embodiments, a shorter connector 108 and a taller connector 106 may extend from printed circuit boards 104A and/or 104B. Other dimensions and other placements of the connector for the primary printed circuit board 102 and secondary printed circuit boards 140A and 104B are readily devised as the embodiments are not limited to placement of the connectors on opposed peripheral edges of the primary printed circuit board. Circuit traces, integrated circuits and other components mounted to the primary printed circuit board 102 are not shown, and could be placed on one or both faces of the primary printed circuit board 102.

Each secondary printed circuit board 104 has a connector 110 that couples to the connector or connectors 106, 108 of the primary printed circuit board 102 as will be further described below. Each secondary printed circuit board 104 (in this embodiment) has a cutout 112 along one edge of the secondary printed circuit board 104, although further embodiments could employ a notch, an aperture, or a pass-through connector, or multiples of these in various combinations, as a bypass feature, as will be described in further embodiments. The cutout 112 can be formed by removing material from an edge of a printed circuit board, e.g., by sawing, laser cutting, stamping, forming, or other manufacturing technique readily devised by a person skilled in the art. The cutout 112A of a first one of the secondary printed circuit boards 104A aligns with the taller connector 106 of the primary printed circuit board 102. When the connector 110A of the first one of the secondary printed circuit boards 104A is coupled to the shorter connector 108 of the primary printed circuit board 102, the cutout 112A straddles and provides clearance from the secondary printed circuit board 104A to the taller connector 106 of the primary printed circuit board 102. Thus, cutout 112A allows access for the electrical connection between secondary printed circuit board 104 B and primary printed circuit board 102. The coupling is depicted by the downward pointing dashed-line arrow to the right side of FIG. 1, and the clearance is depicted by the downward pointing dashed-line arrow to the left side of FIG. 1.

A second one of the secondary printed circuit boards 104B is rotated about (or, relative to) the vertical axis 116, by about 180 degrees relative to the first one of the secondary printed circuit board 104A. This rotation is performed prior to assembly of the second one of the secondary printed circuit boards 104B to the primary printed circuit board 102. For example, the connector 110A of the first one of the secondary printed circuit boards 104A is seen by an observer as closer from the viewpoint of FIG. 1, and the cutout 112A of the first one of the secondary printed circuit boards 104A is seen as farther away. The connector 110B of the second one of the secondary printed circuit boards 104B is seen as farther away in the viewpoint of FIG. 1, and the cutout 112B of the second one of the secondary printed circuit boards 104B is seen as closer, as a result of this rotation.

The connector 110B of the second one of the secondary printed circuit boards 104B couples to the taller connector 106 of the primary printed circuit board 102 through the cutout 112A of the first one of the secondary printed circuit boards 104A as depicted as the downward pointing dashed-line arrow to the left side of FIG. 1. The cutout 112A of the first one of the secondary printed circuit boards 104A provides clearance (i.e., noninterference) from the first one of the secondary printed circuit boards 104A to both the taller connector 106 of the primary printed circuit board 102 and the connector 110B of the second one of the secondary printed circuit boards 104B. In some embodiments connector 110B extends through cutout 112A, however this is not meant to be limiting as connector 106 may extend through cutout 112A in other embodiments. Various further embodiments are possible as FIG. 1 is not meant to be limiting. In one embodiment, the connector 110 on each of the secondary printed circuit boards 104 is double-sided (not shown in FIG. 1, but see FIGS. 5A-5D). The second one of the secondary printed circuit boards 104B is rotated by about 180 degrees relative to the horizontal axis 114, i.e., flipped. In another embodiment, a notch is used on each of the secondary printed circuit boards 104, in place of the cutout 112. In a further embodiment, an aperture is used on each of the secondary printed circuit boards 104, in place of the cutout 112.

In a still further embodiment, a double-sided connector with pass-throughs for signals is used in place of the cutout 112 on each of the secondary printed circuit boards 104. In this embodiment, the connector 110B of the second one of the secondary printed circuit boards 104B couples to the double-sided connector of the first one of the secondary printed circuit boards 104A, which couples to the connector 106 of the primary printed circuit board 102. In such an embodiment, the connector 106 does not need to be taller than the other connector 108 of the primary printed circuit board 102. Thus, it is seen in the above embodiments and variations thereof, that the connector 110B of the second one of the secondary printed circuit boards 104B couples to one of the connectors 106 of the primary printed circuit board via a cutout, notch, aperture or pass-through connector, i.e., the bypass feature, of the first one of the secondary printed circuit boards 104A. In turn, the connector 110A of the first one of the secondary printed circuit boards 104A couples to another one of the connectors 108 of the primary printed circuit board 102. The arrangement sandwiches one of the secondary printed circuit boards 104A between the primary printed circuit board 102 and another one of the secondary printed circuit boards 104B in a stacked arrangement.

Figure 2A:
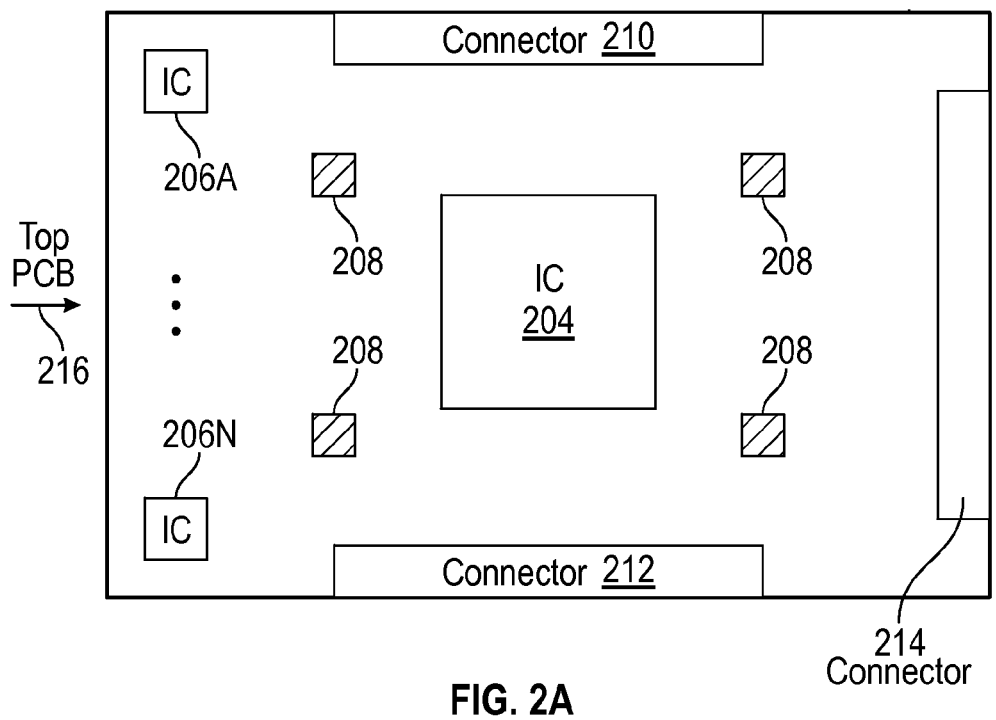
FIG. 2A is an overhead view of a primary printed circuit board, suitable for use in an embodiment of the assembly of stacked printed circuit boards of FIG. 1.

FIG. 2A is an overhead view of a primary printed circuit board, suitable for use in an embodiment of the assembly of stacked printed circuit boards of FIG. 1. The top printed circuit board 216 in this embodiment has an integrated circuit (IC) 204 such as a processor, and further integrated circuits 206A through 206N, such as random-access memory (RAM) mounted to the primary printed circuit board 216. These integrated circuits are by way of example only, and should not be seen as limiting in embodiments. A first connector 210 and a second connector 212 are mounted to the primary printed circuit board 216 along opposed edges, but could be placed elsewhere in further embodiments. A third connector 214 is mounted to a further edge of the primary printed circuit board 216, but could be placed elsewhere. In the embodiment shown, the third connector 214 is a backplane connector, but could be another type of connector. The first and second connectors 210, 212 couple the primary printed circuit board 216 to the secondary printed circuit boards 218A and 218B, as will be described below with reference to FIG. 2B. In some embodiments, the primary printed circuit board 216 is a double-sided circuit board, and has integrated circuits on both sides (i.e., faces) of the primary printed circuit board 216. Standoffs 208 can be added to the primary printed circuit board 216, in various locations, for mechanical support. In some embodiments, pass through connectors, also referred to as feed through connectors may be utilized in place of standoffs 208 for mechanical/structural support.

Figure 2B:
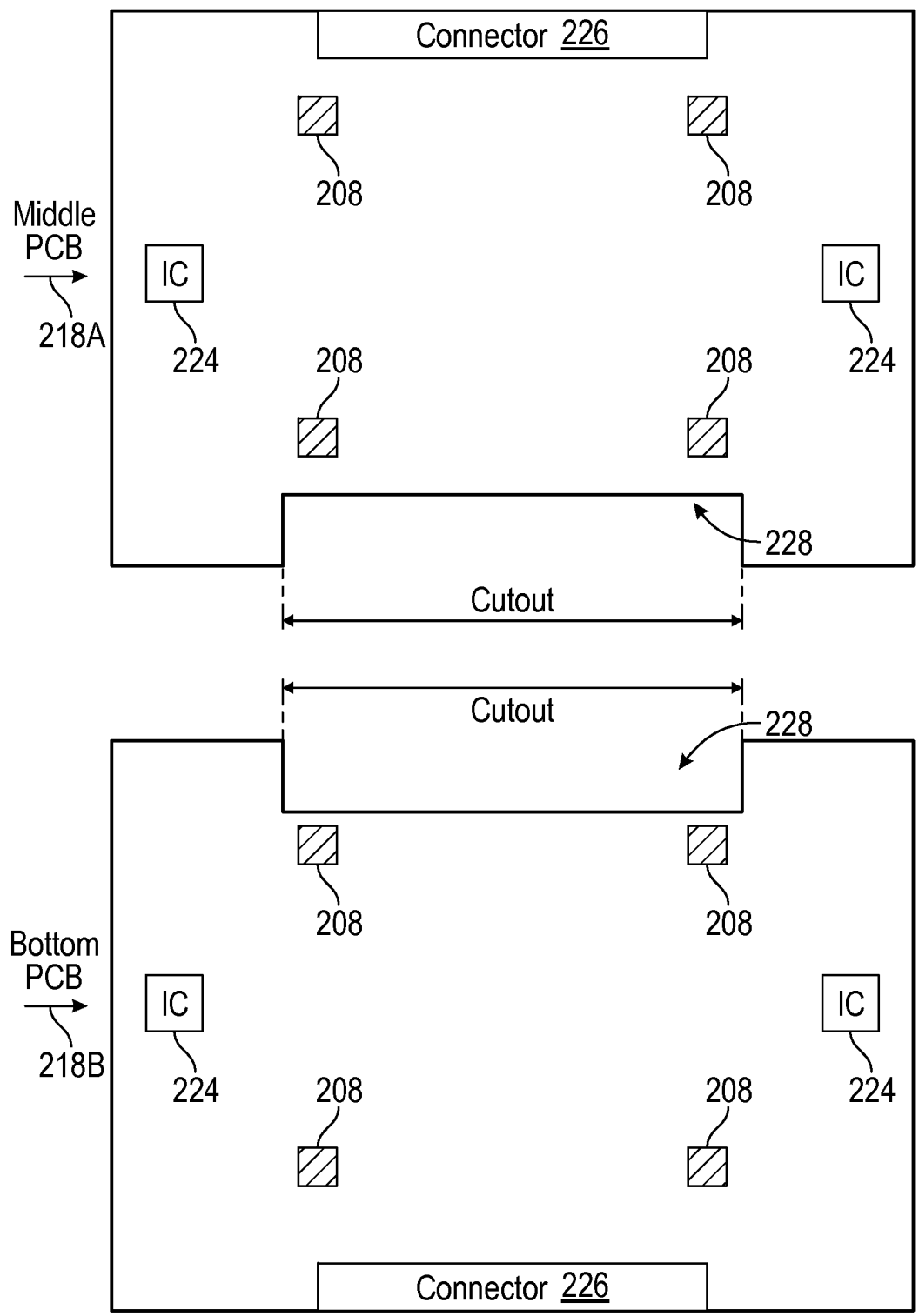
FIG. 2B is an overhead view of two secondary printed circuit boards, each with a bypass feature and suitable for use in an embodiment of the assembly of stacked printed circuit boards of FIG. 1.

FIG. 2B is an overhead view of two identical secondary printed circuit boards, each with a bypass feature and suitable for use in an embodiment of the assembly of stacked printed circuit boards of FIG. 1. To form the assembly, the top printed circuit board 216, the middle printed circuit board 218A and the bottom printed circuit board 218B are stacked similarly to the arrangement shown in FIG. 1. If the entire assembly is inverted, the bottom printed circuit board 218B can serve as a top printed circuit board, and the top printed circuit board 216 can serve as a bottom printed circuit board. Alternatively, the entire assembly could be oriented from left to right or front to back, and so on. The middle printed circuit board 218A and the bottom printed circuit board 218B are identical to each other, i.e., are copies of each other, and each is rotated one half circle (i.e., 180 degrees) relative to the other (e.g., about a vertical axis 116 that is perpendicular to each of the printed circuit boards 218A and 218B). Alternatively, one of the printed circuit boards 218A and 218B could be flipped relative to the other printed circuit board 218A and 218B (i.e., rotated one half circle or 180 degrees relative to a horizontal axis 114 that is parallel to the printed circuit board 218A and 218B, as seen in FIG. 1). Each of the printed circuit boards 218A and 218B has a bypass feature, in this embodiment a cutout 228. Each of the printed circuit boards 218A and 218B has various integrated circuits 224, and may have standoffs 208. Integrated circuits 224 could be storage memory or other types of integrated circuits, in various embodiments, and can be on one or both sides (i.e., faces) of the printed circuit boards 218A and 218B. It should be appreciated that the copies of the printed circuit boards are not limited to identical copies as minor manufacturing differences, as well as other differences that do not impact the ability to stack, rotate, and/or flip the boards as described herein may be integrated into the embodiments.

When the top printed circuit board 216, the middle printed circuit board 218A, and the bottom printed circuit board 218B are stacked, electrical connections are made as follows. The first connector 210 of the top printed circuit board 216 couples to the connector 226 of the middle printed circuit board 218A. The second connector 212 of the top printed circuit board 216 aligns with and passes through the cutout 228 of the middle printed circuit board 218A, with the cutout 228 dimensioned to provide clearance to the second connector 212 in some embodiments. Upon passing through the cutout 228 of the middle printed circuit board 218, the second connector 212 of the top printed circuit board 216 couples to the connector 226 of the bottom printed circuit board 218B.

Figure 2C:
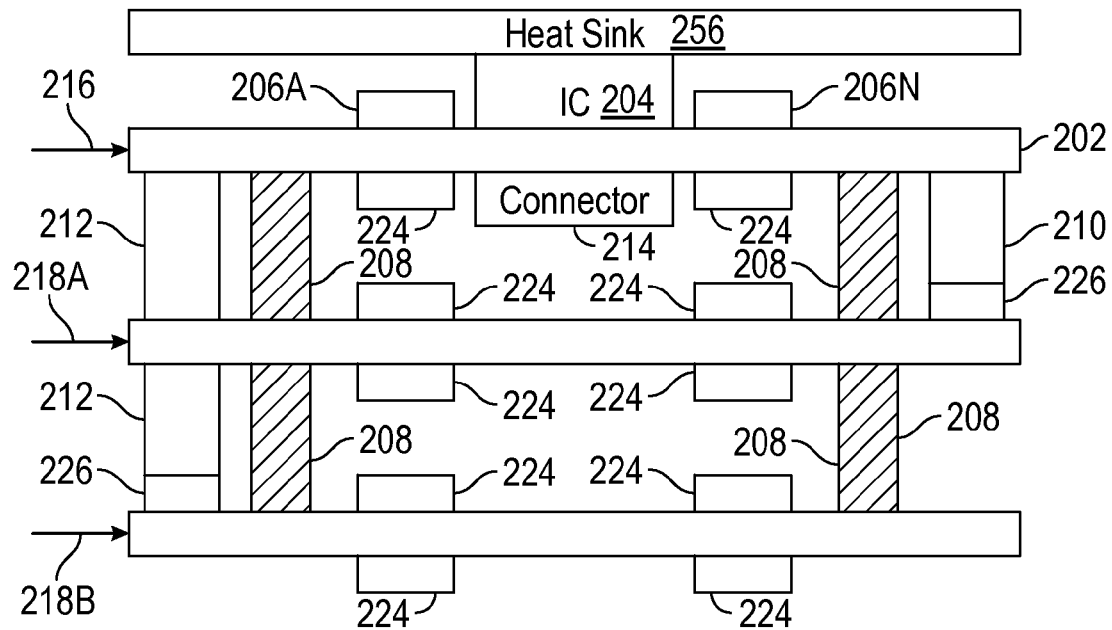
FIG. 2C is a side view of an assembly of stacked printed circuit boards, which uses the primary printed circuit board of FIG. 2A and the two secondary printed circuit boards of FIG. 2B.

FIG. 2C is a side view of an assembly of stacked printed circuit boards, which uses the primary printed circuit board 216 of FIG. 2A and the two identical secondary printed circuit boards 218A and 218B of FIG. 2B. One of the integrated circuits 204 of the primary printed circuit board 216 has a heatsink 256, in this embodiment. Further embodiments could have fewer or more heatsinks 256, or other cooling arrangements, etc., as heatsink 256 is optional. The third connector 214 is available for coupling the primary printed circuit board 216 to a further device, such as a backplane or one or more further printed circuit boards, etc. On the right side of FIG. 2C, the first connector 210 of the top printed circuit board 216 (i.e., the primary printed circuit board) can be seen coupled to the connector 226 of the middle printed circuit board 218A (i.e., of the secondary printed circuit board closest to the primary printed circuit board 216). On the left side of FIG. 2C, the second connector 212 of the top printed circuit board 216 can be seen coupling via the bypass feature of the middle printed circuit board 218A to the connector 226 of the bottom printed circuit board 218B (i.e., of the secondary printed circuit board that is further away from the primary printed circuit board 216). That is, a portion of the second connector 212 passes through the cutout 228 of the middle printed circuit board 218A, as shown by single segment dashed lines in FIG. 2C. As noted above, in alternative embodiments, connector 226 may extend through cutout 228 to mate with connector 212. Standoffs 208 are used in some embodiments, to support the various printed circuit boards 216, 218A and 218B, and can be placed in suitable locations as readily devised.

Figure 2D:
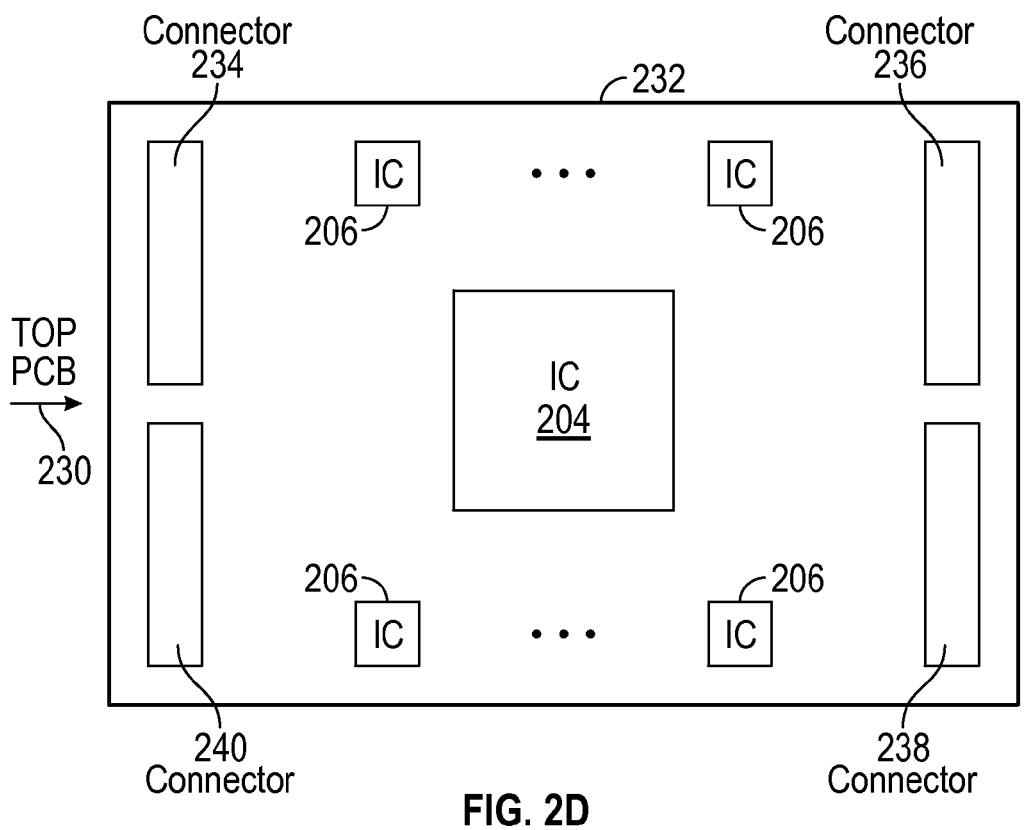
FIG. 2D is an overhead view of a further primary printed circuit board, suitable for use in an embodiment of the assembly of stacked printed circuit boards of FIG. 1.

FIG. 2D is an overhead view of a further primary printed circuit board 232, suitable for use in an embodiment of the assembly of stacked printed circuit boards of FIG. 1. Primary printed circuit board 232 could have one or more integrated circuits 204A-204N and 206A-N, such as a processor and memory, or other types of integrated circuits. Various connectors 234, 236, 238, 240 are arranged to couple with two or more secondary printed circuit boards, in various embodiments. For example, each of the connectors 234, 236, 238, 240 could be arranged to couple to one of four secondary printed circuit boards. Or, two of the connectors 234, 240 could be arranged to couple to one of two secondary printed circuit boards, with the other two of the connectors 236, 238 arranged to couple to the other of the two secondary printed circuit boards. Diagonally opposed connectors 234, 238 could couple to one of the secondary printed circuit boards, with further diagonally opposed connectors 236, 240 coupling to another of the secondary printed circuit boards, and so on. In some embodiments connectors 234 and 240 could couple to connectors on a same side of a secondary printed circuit board. Connectors 236 and 238 could likewise couple to connectors on a same side of a secondary printed circuit board.

Figure 2E:
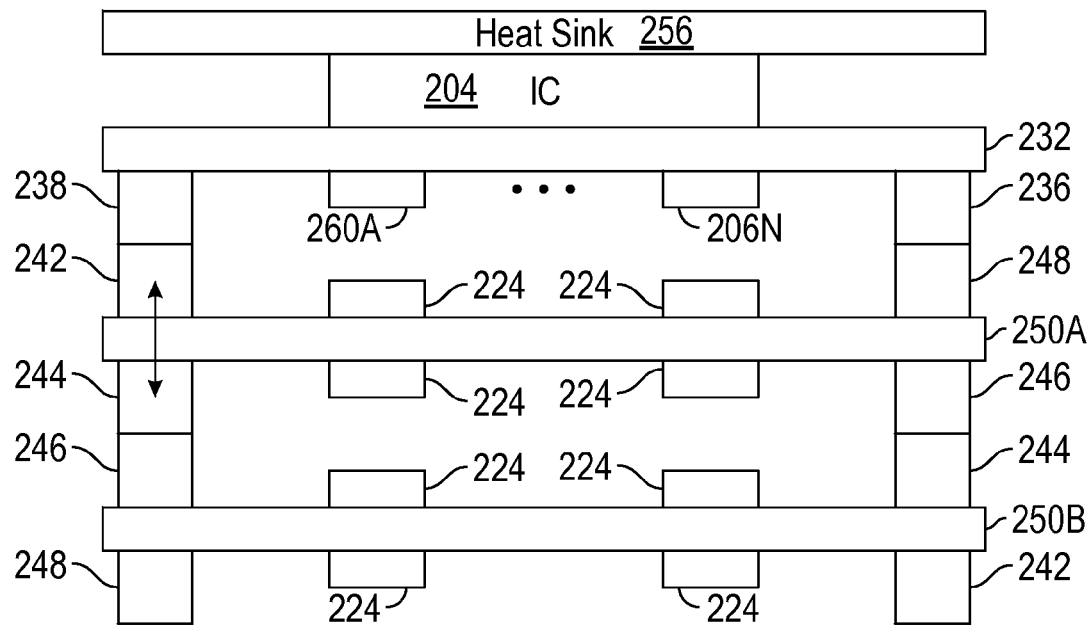
FIG. 2E is a side view of a further assembly of stacked printed circuit boards, which uses the primary printed circuit board of FIG. 2D and two secondary printed circuit boards.

FIG. 2E is a side view of a further assembly of stacked printed circuit boards, which uses the primary printed circuit board 232 of FIG. 2D and two identical copies of secondary printed circuit boards 250A and 250B. In this embodiment, the top printed circuit board 232 has an integrated circuit 204 with a heatsink 256, and various further integrated circuits 206A-206N, although further types and arrangements of integrated circuits are readily devised. Each of the secondary printed circuit boards 250A and 250B has further integrated circuits 224. In each of the printed circuit boards 232, 250A and 250B, integrated circuits could be on one or both sides (i.e., faces) of the printed circuit board 232, 250A and 250B. The secondary printed circuit boards 250A and 250B each have double-sided connectors, i.e., connectors on both sides or faces of the printed circuit board. Some of the connectors 242, 244 are or include feedthrough connectors, which pass signals or other electrical connections from one side or face of the printed circuit board 250A and 250B to the other side or face of the printed circuit board. The feedthrough connector 242, 244, in this embodiment, acts as a bypass feature. One of the secondary printed circuit boards 250A and 250B is flipped (e.g., rotated one half circle or 180 degrees about an axis extending from the page) relative to the other of the secondary printed circuit boards 250A and 250B. Electrical connections among the top printed circuit board 232, middle printed circuit board 250A and bottom printed circuit board 250B in FIG. 2E are as follows.

A first connector 236 of the top printed circuit board 232 couples to a connector 248 of the middle printed circuit board 250A. This electrically couples the top printed circuit board 232 to the middle printed circuit board 250A. A second connector 238 of the top printed circuit board 232 couples to a connector 242 of the middle printed circuit board 250A. This connector 242, in combination with a further connector 244 of the middle printed circuit board 250A, has or includes one or more feedthrough connectors, and acts as a bypass feature. The connector 244 couples to a connector 246 of the bottom printed circuit board 250B. Thus, the second connector 238 of the top printed circuit board 232 couples to the connector 246 of the bottom printed circuit board 250B via a bypass feature of the middle printed circuit board 250A, namely the feedthrough connector included in the connectors 242, 244 of the middle printed circuit board 250A. This electrically couples the top printed circuit board 232 to the bottom printed circuit board 250B. In further embodiments, one of the secondary printed circuit boards 250A and 250B could be rotated and/or flipped along another axis, or further secondary printed circuit boards 250 could be rotated and/or flipped relative to one or the other of the secondary printed circuit boards 250 and added to the arrangement shown in FIG. 2E. Stacks of two, three, four or more secondary printed circuit boards 250 can be devised with various arrangements of feedthrough connectors, which may be referred to as pass-through connectors, and/or cutouts, notches or apertures and relative rotations, flipping or combinations thereof among the secondary printed circuit boards 250, in various orders.

Figures 3A, 3B:
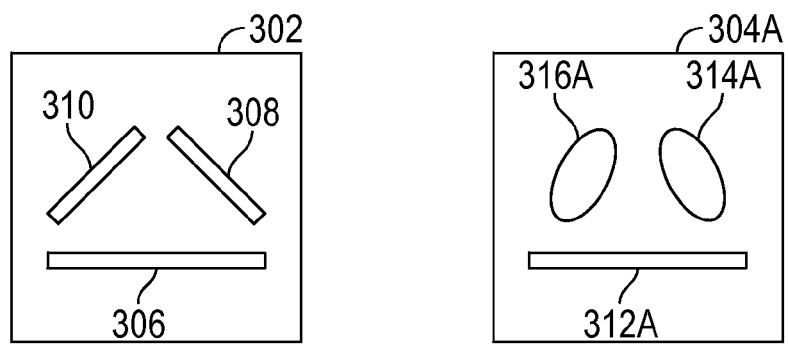
FIG. 3A is an overhead view of a primary printed circuit board with a triangular arrangement of connectors.
FIG. 3B is an overhead view of a secondary printed circuit board with a triangular arrangement of a connector and two apertures, in a first orientation.

FIG. 3A is an overhead view of a primary printed circuit board 302 with a triangular arrangement of connectors 306, 308, 310. This arrangement can be generalized to other polygonal arrangements of connectors, such as square (see FIGS. 4A-4D), pentagon, hexagon, heptagon, octagon, nonagon, etc. Each of the connectors 306, 308, 310 couples to a secondary printed circuit board 304. Integrated circuits or other electrical or electronic components can be arranged on this and other embodiments as readily devised.

FIG. 3B is an overhead view of a secondary printed circuit board 304A with a triangular arrangement of a connector 312A and two apertures 314A, 316A, in a first orientation. When stacked onto the primary printed circuit board 302 of FIG. 3A, the connector 312A of the secondary printed circuit board 304A couples to the first connector 306 of the primary printed circuit board 302. Meanwhile, the apertures 314A, 316A act as a bypass feature of the first instance or copy of the secondary printed circuit board 304A, and allow the other two connectors 308, 310 to physically pass through the secondary printed circuit board 304A.

Figures 3C, 3D:
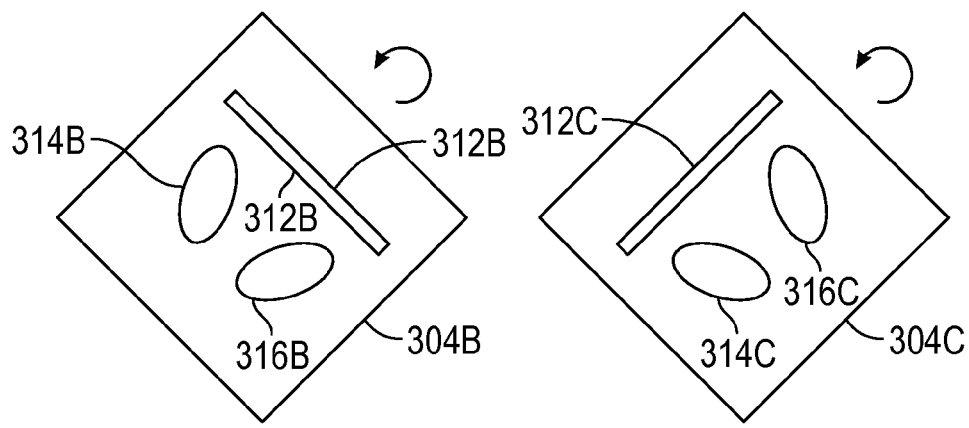
FIG. 3C is an overhead view of a secondary printed circuit board with a triangular arrangement of a connector and two apertures, in a second orientation.
FIG. 3D is an overhead view of a secondary printed circuit board with a triangular arrangement of a connector and two apertures, in a third orientation.

FIG. 3C is an overhead view of a secondary printed circuit board 304B with a triangular arrangement of a connector 312B and two apertures 314B, 316B, in a second orientation. The second orientation has the second instance or copy of the secondary printed circuit board 304B rotated one third of a circle (i.e., 120 degrees) relative to the first instance of the secondary printed circuit board 304A. In this case, the rotation is counterclockwise, although clockwise rotation can be used. When the second instance or copy of the secondary printed circuit board 304B is stacked onto the first instance or copy of the secondary printed circuit board 304A (which, in turn is already stacked onto the primary printed circuit board 302), a second connector 308 of the primary printed circuit board 302 couples to the connector 312B of the secondary printed circuit board 304B. This couples the primary printed circuit board 302 to the second instance of the secondary printed circuit board 304B via the bypass feature of the first instance of the secondary printed circuit board 304A. Specifically, the second connector 308 of the primary printed circuit board 302 passes through the aperture 314A of the first instance of the secondary printed circuit board 304A, to couple to the connector 312B of the second instance of the secondary printed circuit board 304B. Meanwhile, the third connector 310 passes through both an aperture 316A of the first instance of the secondary printed circuit board 304A and an aperture 314B of the second instance of the secondary printed circuit board 304B.

FIG. 3D is an overhead view of a secondary printed circuit board 304C with a triangular arrangement of a connector 312C and two apertures 314C, 316, in a third orientation. The third orientation has the third instance of the secondary printed circuit board 304C rotated one third of a circle relative to the second instance of the secondary printed circuit board 304B, and rotated two thirds of a circle (i.e., 240 degrees) relative to the first instance of the secondary printed circuit board 304A. In this case, the rotation is counterclockwise, although clockwise rotation can be used. For example, the third instance of the secondary printed circuit board 304C can be seen as rotated one third of the circle clockwise relative to the first instance of the secondary printed circuit board 304A. When the third instance of the secondary printed circuit board 304C is stacked onto the second instance of the secondary printed circuit board 304B (which is stacked as above), the third connector 310 of the primary printed circuit board 302 couples to the connector 312C of the secondary printed circuit board 304C. This couples the primary printed circuit board 302 to the third instance of the secondary printed circuit board 304C via the bypass feature of the first instance of the secondary printed circuit board 304A and the bypass feature of the second instance of the secondary printed circuit board 304B. Specifically, the third connector 310 of the primary printed circuit board 302 passes through the aperture 316A of the first instance of the secondary printed circuit board 304A and the aperture 314B of the second instance of the secondary printed circuit board 304B, to couple to the connector 312C of the third instance of the secondary printed circuit board 304C. In variations, the bypass feature of the secondary printed circuit board 304 could be any of the other types of bypass features previously described. Connectors of the primary printed circuit board 302 could be of differing heights in order to pass through the apertures 314, 316. Alternatively, the connector 312 of the secondary printed circuit board 304 could be elongated so as to pass through one or more apertures of further instances of secondary printed circuit board 304. Combinations of flipping and rotation could be used for instances of the secondary printed circuit board 304. It should be appreciated that while the secondary printed circuit boards 304 are copies of each other this is not meant to be limiting. In some embodiments, secondary printed circuit boards 304 may have different shapes, e.g., may not be all square, but otherwise be copies of each other. In some embodiments, printed circuit boards 304 may be circular in shape.

FIG. 4A is an overhead view of a primary printed circuit board 402 with a square arrangement of connectors 404, 406, 408, 410. The connectors 404, 406, 408, 410 are of differing heights (see FIG. 4C) so as to reach up to respective secondary printed circuit boards 420 in a stack of printed circuit boards. Functionality of the embodiment depicted in FIGS. 4A-4D is related to that of the embodiment depicted in FIGS. 3A-3D, generalized to polygonal arrangements. Various integrated circuits can be mounted to the primary printed circuit board 402.

FIG. 4B is an overhead view of a secondary printed circuit board 420 with a square arrangement of a connector 412 and three apertures 414, 416, 418 (depicted in shadow). The apertures 414, 416, 418 act as a bypass feature, which could also be embodied as any of the bypass features described above (e.g., feed through connectors, notches, cutouts). Various integrated circuits can be mounted to the secondary printed circuit board 420. The apertures 414, 416, 418 are dimensioned to provide clearance to the connector 404 of the primary printed circuit board 402 at various angles of rotation for copies of the secondary printed circuit board 420.

FIG. 4C is a perspective view of the primary printed circuit board 402 of FIG. 4A. The first connector 404 of the primary printed circuit board 402 is of a relatively short height, in order to couple with the connector 412 of a first instance of the secondary printed circuit board 420. The second connector 410, third connector 408 and fourth connector 406 are increasingly taller in height, in order to couple with the connector 412 of the second instance, third instance and fourth instance, respectively, of the secondary printed circuit board 420. It should be appreciated that the embodiments enable the placement of the taller and/or shorter connectors on a primary printed circuit board or a secondary printed circuit board.

FIG. 4D is a perspective view of the secondary printed circuit board 420 of FIG. 4B. Apertures 414, 416, 418 are shown in shading to denote passage through the secondary printed circuit board 420. To create a stack of four instances of the secondary printed circuit board 420, a first instance or copy of the secondary printed circuit board 420 is assembled to the primary printed circuit board 402, with the connector 412 of the first instance of the secondary printed circuit board 420 coupled to the first connector 404 of the primary printed circuit board 402. For example, the primary printed circuit board 402 could be flipped upside down from the orientation shown in FIG. 4C, and applied as the top printed circuit board, with the first instance of the secondary printed circuit board 420 appearing as the next printed circuit board down from the top. A second instance or copy of the secondary printed circuit board 420 is then rotated one quarter of a circle (i.e., 90 degrees) counterclockwise relative to the first instance of the secondary printed circuit board 420, and is assembled to the first instance of the secondary printed circuit board 420. The second connector 410 of the primary printed circuit board 402 reaches down through an aperture 414 of the first instance of the secondary printed circuit board 420, and couples to the connector 412 of the second instance of the secondary printed circuit board 420. A third instance or copy of the secondary printed circuit board 420 is rotated one quarter of a circle counterclockwise relative to the second instance of the secondary printed circuit board 420, and is assembled to the second instance of the secondary printed circuit board 420. The third connector 408 of the primary printed circuit board 402 reaches down through an aperture 416 of the first instance of the secondary printed circuit board 420, and down through an aperture 414 of the second instance of the secondary printed circuit board, and couples to the connector 412 of the third instance of the secondary printed circuit board. A fourth instance or copy of the secondary printed circuit board 420 is rotated one quarter of a circle counterclockwise relative to the third instance of the secondary printed circuit board 420, and is assembled to the third instance of the secondary printed circuit board 420. The fourth connector 406 of the primary printed circuit board 402 reaches down through an aperture 418 of the first instance of the secondary printed circuit board 420, down through an aperture 416 of the second instance of the secondary printed circuit board 420, and down through an aperture 414 of the third instance of the secondary printed circuit board 420, and couples to the connector 412 of the fourth instance of the secondary printed circuit board 420. In this manner, the primary printed circuit board 402 couples to each of the four secondary printed circuit boards 420, where the secondary printed circuit boards are copies of each other. Each successive secondary printed circuit board 420 is coupled to via the bypass feature of each preceding secondary printed circuit board 420 in the stack. In a variation, one of the secondary printed circuit boards 420 could be rotated by one half circle (i.e., 180 degrees) relative to the preceding or following secondary printed circuit board 420, and so on.

In a further variation, the connector 412 could include feedthrough paths. A portion of the connector 404 of the primary printed circuit board 402 would couple to a portion of the connector 412 of a first instance of the secondary printed circuit board 420. A further portion of the connector 404 would apply the feedthrough paths of the connector 412 as a bypass feature of the first instance of the secondary printed circuit board 420, and couple to the connector 412 of a flipped second instance of the secondary printed circuit board 420. Then, the third instance of the secondary printed circuit board 420 would be rotated one quarter of a circle, as would a flipped fourth instance of the secondary printed circuit board 420. These would couple similarly to the second connector 410 of the primary printed circuit board 402. Fifth, sixth, seventh and eighth instances or copies of the secondary printed circuit board 420 could then be assembled to the stack. Further variations of flipping and rotating and combinations thereof are readily devised.

Figure 5A:
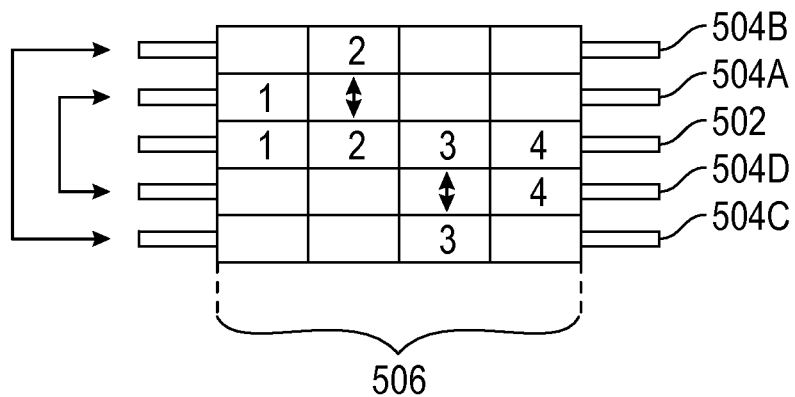
FIG. 5A is a side view of an assembly of stacked printed circuit boards in accordance with a further embodiment of the present disclosure.

FIG. 5A is a side view of an assembly of stacked printed circuit boards in accordance with a further embodiment of the present disclosure. In this embodiment, the primary printed circuit board 502 and the secondary printed circuit boards 504A, 504B, 504C, 504D have connectors 506 with various combinations of connectivity and feedthroughs. For convenience of discussion and analysis, each of the connectors 506 shown in FIG. 5A has a numerical label showing connectivity. To create the stack of printed circuit boards shown in this embodiment, assembly is as follows. Starting with the primary printed circuit board 502, a first instance or copy of the secondary printed circuit board 504A is assembled to a top face of the primary printed circuit board 502, so that the regions labeled "1" of the connectors 506 are coupled. This couples the primary printed circuit board 502 to the first instance of the secondary printed circuit board 504A. A second instance or copy of the secondary printed circuit board 504B is rotated relative to the first instance of the secondary printed circuit board 504A and assembled to the first instance of the secondary printed circuit board 504A. This couples the regions labeled "2" of the connectors 506, via a bypass feature (labeled with double headed arrow) of the first instance of the secondary printed circuit board 504A, coupling the primary printed circuit board 502 to the second instance of the secondary printed circuit board 504B. Two more instances or copies of the secondary printed circuit board 504 are assembled to each other, with one instance rotated relative to the other, and this assembly is then flipped relative to the first and second instances of the secondary printed circuit board 504A, 504B. These are then assembled to the bottom face of the primary printed circuit board 502, so that the regions labeled "3" of the connectors 506 are coupled to each other, and the regions labeled "4" of the connectors 506 are coupled to each other. Variations on this and other embodiment are readily devised, with various combinations of rotation and flipping, and differing sequences of which printed circuit board is assembled to which other printed circuit board(s) in which order. In some embodiments a portion of the pins of a pass through or feed through may proceed to a circuit board having the pass through or the feed through and a portion of the pins may proceed to one or more circuit boards above or below the circuit board having the pass through or feed through. That is, the pass through circuit board 504A may have a portion of pins feeding through to circuit board 504B and a portion of pins proceeding to circuit board 504A in one embodiment. As noted above, it should be appreciated that numerous other configurations are possible.

Figure 5B:
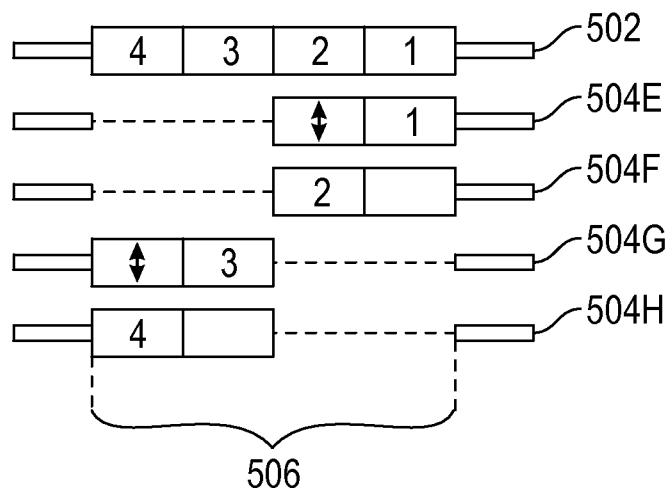
FIG. 5B is a side view of a further embodiment of the assembly of stacked printed circuit boards of FIG. 5A.
Figure 5C:
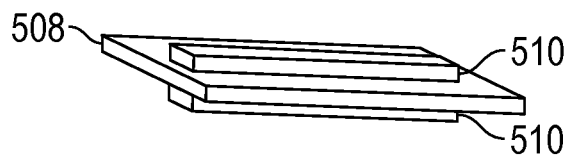
FIG. 5C is a perspective view of a printed circuit board with a double-sided connector, suitable for use in the assembly of FIG. 5A.
Figure 5D:
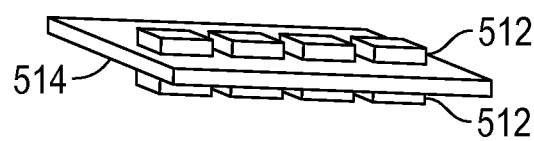
FIG. 5D is a perspective view of a printed circuit board with multiple double-sided connectors, suitable for use in the assembly of FIG. 5A.
Figure 5E:
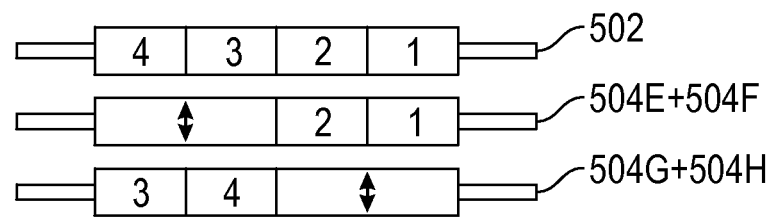
FIG. 5E is a further embodiment of the stacked printed circuit board of FIG. 5B having a more compact form factor.

FIG. 5B is a side view of a further embodiment of the assembly of stacked printed circuit boards of FIG. 5A. Here, all of the secondary printed circuit boards 504E, 504F, 504G, and 504H are assembled to the same side of the primary printed circuit board 502. The bypass feature in this embodiment combines apertures, notches or cutouts, and feedthroughs. Apertures are shown as dashed lines, and feedthroughs are shown as double headed arrows. Connectivity is indicated by numerical labels in the connectors 506. Further variations with flipping, rotation, and further combinations of bypass features are readily devised in keeping with the teachings herein. FIG. 5C is a perspective view of a printed circuit board 508 with a double-sided connector 510, suitable for use in the assembly of FIG. 5A. The double-sided connector could include various regions for connectivity, and feedthroughs. That is, double sided connector 510 integrates the connector and bypass features. In some embodiments, multiple connectors 510 may be disposed on different edges as illustrated in FIG. 2D. FIG. 5D is a perspective view of a printed circuit board 514 with multiple double-sided connectors 512, suitable for use in the assembly of FIG. 5A. Each double-sided connector 512 could have uniform connectivity to signal lines on the printed circuit board 514, or feedthroughs not connected to anything else on the printed circuit board 514, or combinations of these. FIG. 5E is a further embodiment of the stacked printed circuit board of FIG. 5B having a more compact form factor. In this embodiment, secondary printed circuit boards 504E and 504F, as well as secondary printed circuit boards 504G and 504H, each have been collapsed into a single printed secondary printed circuit board. Feedthroughs exist on each of the secondary printed circuit boards and in some embodiments these feedthroughs function as structural support for the assembly. In some embodiments, the feedthroughs may be a 3 millimeter connector or other suitable connector. In some of the embodiments of FIGS. 5A-5E, the feedthrough connectors may have all pins dedicated to a particular printed circuit board or a portion of the pins may be designated for a first printed circuit board and a portion of the pins designated to another one or more printed circuit boards. In some embodiments a feedthrough connector could couple to another feedthrough connector where all pins pass through one or more feedthrough connectors.

Figure 6:
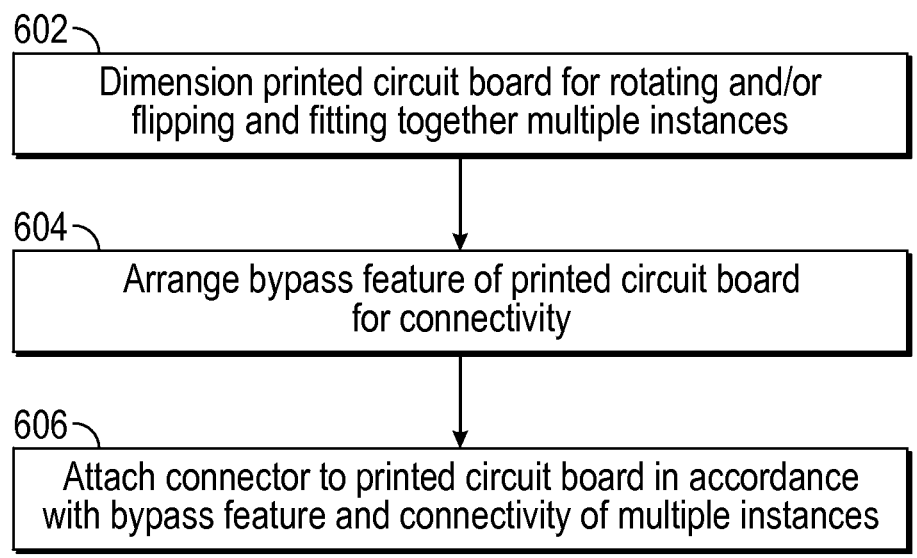
FIG. 6 is a flow diagram of a method of arranging printed circuit boards for high density, which can produce embodiments such as those shown in FIGS. 1-5D, and can produce various further embodiments.

FIG. 6 is a flow diagram of a method of arranging printed circuit boards for high density, which can produce embodiments such as those shown in FIGS. 1-5D, and can produce various further embodiments. The method can be practiced by automated manufacturing equipment of various types, and can also be practiced by engineers, technicians or other personnel using manually operated manufacturing equipment. Results of practicing the method include embodiments of the secondary printed circuit board, and printed circuit board assemblies based thereupon. In a first action 602, a printed circuit board is dimensioned for rotating and/or flipping and fitting together multiple instances or copies of the printed circuit board. Suitable shapes for such a printed circuit board include regular and irregular geometric shapes such as squares, rectangles, triangles, quadrilaterals, polygons, circles, ovals, etc. In a second action 604, a bypass feature of the printed circuit board is arranged for connectivity. Electrical connection to one copy of the printed circuit board can proceed via the bypass feature of another copy of the printed circuit board, with the printed circuit boards fitted together rotated and/or flipped relative to each other as described above.

In a third action 606, a connector is attached to the printed circuit board in accordance with the bypass feature and the connectivity of multiple copies of the printed circuit board as described above with reference to FIGS. 1-5D. For example, electrical connection to a first copy of the printed circuit board can proceed via the connector of the first copy of the printed circuit board. Electrical connection to a second copy of the printed circuit board can proceed via the bypass feature of the first copy of the printed circuit board and the connector of the second copy of the printed circuit board, with the first and second copies of the printed circuit board fitted together rotated and/or flipped relative to each other.

Detailed illustrative embodiments are disclosed herein. However, specific functional details disclosed herein are merely representative for purposes of describing embodiments. Embodiments may, however, be embodied in many alternate forms and should not be construed as limited to only the embodiments set forth herein. It should be appreciated that the connectors may utilize a male and female type of arrangement or other suitable arrangements for providing connections or couplings among printed circuit boards.

It should be understood that although the terms first, second, etc. may be used herein to describe various steps or calculations, these steps or calculations should not be limited by these terms. These terms are only used to distinguish one step or calculation from another. For example, a first calculation could be termed a second calculation, and, similarly, a second step could be termed a first step, without departing from the scope of this disclosure. As used herein, the term "and/or" and the "/" symbol includes any and all combinations of one or more of the associated listed items.

As used herein, the singular forms "a", "an" and "the" are intended to include the plural forms as well, unless the context clearly indicates otherwise. It will be further understood that the terms "comprises", "comprising", "includes", and/or "including", when used herein, specify the presence of stated features, integers, steps, operations, elements, and/or components, but do not preclude the presence or addition of one or more other features, integers, steps, operations, elements, components, and/or groups thereof. Therefore, the terminology used herein is for the purpose of describing particular embodiments only and is not intended to be limiting.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Although the method operations were described in a specific order, it should be understood that other operations may be performed in between described operations, described operations may be adjusted so that they occur at slightly different times or the described operations may be distributed in a system which allows the occurrence of the processing operations at various intervals associated with the processing.

Various units, circuits, or other components may be described or claimed as "configured to" perform a task or tasks. In such contexts, the phrase "configured to" is used to connote structure by indicating that the units/circuits/components include structure (e.g., circuitry) that performs the task or tasks during operation. As such, the unit/circuit/component can be said to be configured to perform the task even when the specified unit/circuit/component is not currently operational (e.g., is not on). The units/circuits/components used with the "configured to" language include hardware—for example, circuits, memory storing program instructions executable to implement the operation, etc. Reciting that a unit/circuit/component is "configured to" perform one or more tasks is expressly intended not to invoke 35 U.S.C. 112, sixth paragraph, for that unit/circuit/component. Additionally, "configured to" can include generic structure (e.g., generic circuitry) that is manipulated by software and/or firmware (e.g., an FPGA or a general-purpose processor executing software) to operate in manner that is capable of performing the task(s) at issue. "Configured to" may also include adapting a manufacturing process (e.g., a semiconductor fabrication facility) to fabricate devices (e.g., integrated circuits) that are adapted to implement or perform one or more tasks.

The foregoing description, for the purpose of explanation, has been described with reference to specific embodiments. However, the illustrative discussions above are not intended to be exhaustive or to limit the invention to the precise forms disclosed. Many modifications and variations are possible in view of the above teachings. The embodiments were chosen and described in order to best explain the principles of the embodiments and its practical applications, to thereby enable others skilled in the art to best utilize the embodiments and various modifications as may be suited to the particular use contemplated. Accordingly, the present embodiments are to be considered as illustrative and not restrictive, and the invention is not to be limited to the details given herein, but may be modified within the scope and equivalents of the appended claims.

What is claimed is:

1. A printed circuit board (PCB), comprising:
    a connector extending from a surface of the PCB; and
    a bypass feature extending through the PCB, the PCB constructed so that a first copy of the PCB is configured to be assembled stacked to a second copy of the PCB with the first copy oriented as in an initial position of the PCB and the second copy rotated or flipped relative to the initial position of the PCB, the second copy not oriented same as the initial position of the PCB, wherein an electrical connection to the first copy is accessible via the connector of the first copy, and an electrical connection to the second copy is accessible via the connector of the second copy through the bypass feature of the first copy.

2. The printed circuit board of claim 1, wherein the bypass feature comprises at least one of a pass-through connector, a cutout, an aperture, or a notch.

3. The printed circuit board of claim 1, wherein the electrical connection of the first copy and the electrical connection of the second copy are coupled to a base PCB.

4. The printed circuit board of claim 1, wherein the PCB includes multiple bypass features extending through the PCB.

5. The printed circuit board of claim 3, wherein the base PCB has multiple connectors extending from a surface of the base PCB and wherein each of the multiple connectors have differing heights.

6. The printed circuit board of claim 1, wherein the first copy and the second copy are identical copies.

7. The printed circuit board of claim 1, wherein the connector and the bypass feature are integrated within a pass-through connector.

8. A printed circuit board (PCB) assembly, comprising:
    a first PCB having a connector and a bypass feature, the first PCB being in a first position;
    a second PCB that is a copy of the first PCB, the second PCB rotated or flipped with respect to the first position of the first PCB, and so assembled stacked to the first PCB, with the second PCB not oriented same as the first position of the first PCB, wherein the connector of the second PCB extends through the bypass feature of the first PCB.

9. The printed circuit board assembly of claim 8, further comprising:
    a base PCB coupled to the first and second PCBs;
    a first connector of the base PCB coupled to the connector of the first PCB; and
    a second connector of the base PCB extending through the bypass feature of the first PCB and coupled to the connector of the second PCB.

10. The printed circuit board assembly of claim 8, further comprising:
    a third PCB that is a copy of the first PCB, rotated or flipped with respect to the first PCB and assembled to the second PCB, wherein the connector of the third PCB extends through the bypass feature of the second PCB and the bypass feature of the first PCB.

11. The printed circuit board assembly of claim 8, further comprising:
    a base PCB assembled to the first and second PCBs; and
    multiple additional PCBs rotated or flipped with respect to the first PCB, wherein the base PCB has a number of connectors extending from a surface of the base PCB equal to a number of PCBs assembled to the base.

12. The printed circuit board assembly of claim 8, wherein the connector and the bypass feature of each PCB are integrated within a pass through connector.

13. The printed circuit board assembly of claim 8, wherein the bypass feature of the first PCB and the second PCB includes an aperture located on a peripheral edge of the first PCB and the second PCB.

14. The printed circuit board assembly of claim 8, further comprising:
    a base PCB having a plurality of connectors arranged in a form of a polygon;
    a first one of the plurality of connectors coupled to the connector of the first PCB; and
    a second one of the plurality of connectors coupled to the connector of the second PCB via the bypass feature of the first PCB.

15. A method of assembling a printed circuit board (PCB), comprising:
    providing a first PCB and a second PCB, the second PCB a copy of the first PCB;
    arranging a bypass feature of the first PCB so that an electrical connection to the second PCB proceeds through the bypass feature of the first PCB;
    assembling the first PCB, in a first position, stacked to the second PCB, with the second PCB one of rotated or flipped relative to the first position of the first PCB and not oriented same as the first position of the first PCB; and
    coupling an electrical connector of the first PCB and an electrical connector of the second PCB to a third PCB.

16. The method of claim 15, wherein the first PCB has multiple bypass features.

17. The method of claim 15, wherein the third PCB is a base PCB having a plurality of electrical connectors extending from a surface of the base PCB, each of the plurality of electrical connectors having a different height.

18. The method of claim 15, wherein the bypass feature includes at least one of a cutout, an aperture or a notch.

19. The method of claim 15, wherein each electrical connector is located on a peripheral edge of each PCB and each bypass feature is located on one of a same or an opposing peripheral edge of each PCB.

20. The method of claim 15, wherein each electrical connector and each bypass feature are integrated into a pass through connector for respective PCB.

* * * * *